United States Patent
Kim et al.

(10) Patent No.: US 7,041,594 B2
(45) Date of Patent: May 9, 2006

(54) SEMICONDUCTOR DEVICE FOR APPLYING WELL BIAS AND METHOD OF FABRICATING THE SAME

(75) Inventors: Young-Ok Kim, Gyeonggi-do (KR); Soon-Byung Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 58 days.

(21) Appl. No.: 10/925,429

(22) Filed: Aug. 24, 2004

(65) Prior Publication Data
US 2005/0026329 A1 Feb. 3, 2005

Related U.S. Application Data

(62) Division of application No. 10/630,486, filed on Jul. 29, 2003, now Pat. No. 6,838,737.

(30) Foreign Application Priority Data

Aug. 22, 2002 (KR) ............................... 2002-49780

(51) Int. Cl.
*H01L 21/4763* (2006.01)
(52) U.S. Cl. .................. 438/637; 438/648; 438/675
(58) Field of Classification Search ................ 438/637, 438/648, 675, 666
See application file for complete search history.

(56) References Cited

U.S. PATENT DOCUMENTS

| 6,534,664 B1 | 3/2003 | Guram et al. .................. 556/1 |
| 2002/0125577 A1 | 9/2002 | Komada ...................... 257/774 |
| 2003/0003727 A1* | 1/2003 | Matsubara .................. 438/672 |
| 2003/0008498 A1* | 1/2003 | Nakata ........................ 438/637 |

* cited by examiner

*Primary Examiner*—Phat X. Cao
(74) *Attorney, Agent, or Firm*—Marger Johnson & McCollom, P.C.

(57) ABSTRACT

A first conduction type well is formed in a substrate, and a second conduction type impurity region is formed in the well. A lower interlayer dielectric is formed on the substrate, including the well and the impurity region. A contact plug, connected to the impurity region through the lower interlayer dielectric, is formed with a void inside it. An upper interlayer dielectric is formed on the lower interlayer dielectric and the contact plug. The upper interlayer dielectric is selectively etched, forming an interconnection groove exposing the contact plug. The contact plug and the exposed void are overetched, extending the void into the first conduction type well. The interconnection groove is filled with a conductive layer, forming an interconnection. A seam extending to the well is formed in the void, connecting the contact plug to the well. Due to the seam, a well bias may be applied to the well.

20 Claims, 11 Drawing Sheets

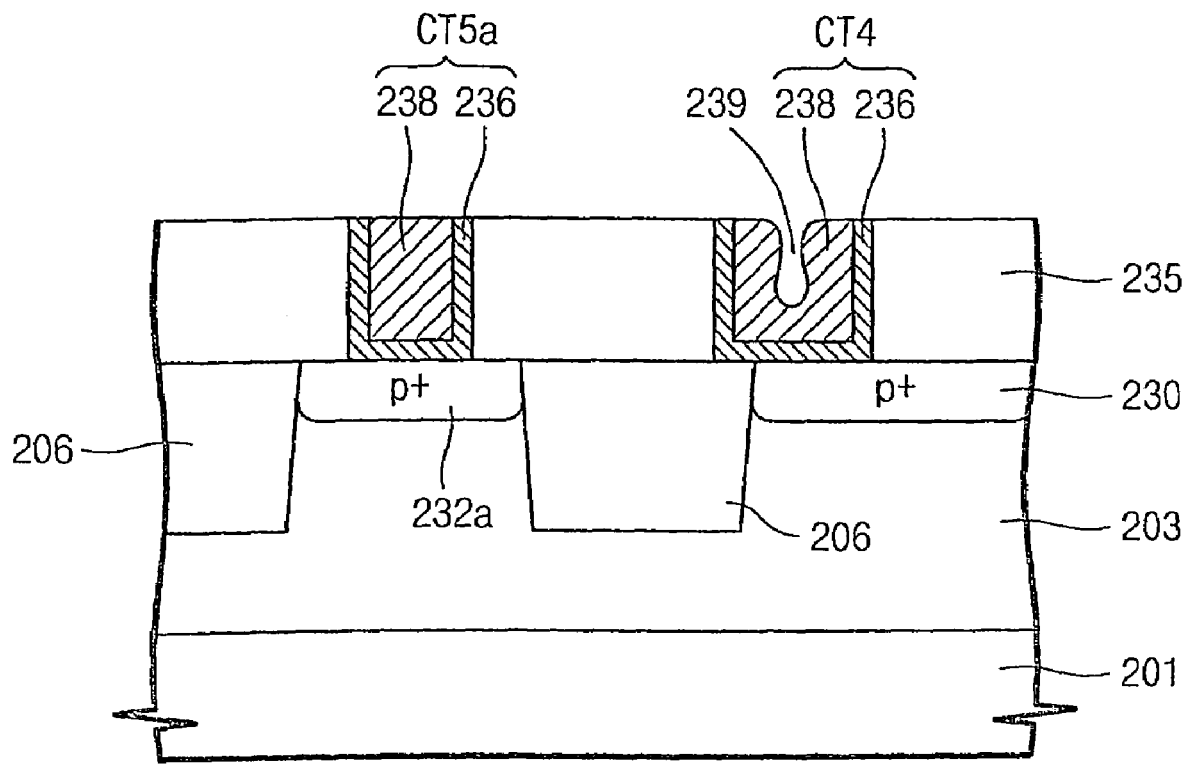

SEMICONDUCTOR DEVICE FOR APPLYING WELL BIAS AND METHOD OF FABRICATING THE SAME

CROSS REFERENCE TO RELATED APPLICATIONS

This application is a divisional of prior application Ser. No.: 10/630,486 filed Jul. 29, 2003, U.S. Pat. No. 6,838,737, the contents of which are herein incorporated by this reference in their entirety.

BACKGROUND OF THE INVENTION

1. Technical Field of the Invention

This disclosure relates to a semiconductor device and more specifically, to a semiconductor device for applying a well bias and a method of fabricating the same.

2. Description of the Related Art

At the present time, advances in VLSI memories leads to considerable power consumption in NMOS devices. Therefore, it is necessary to develop a technology for lowering the power consumption. In view of the necessity, CMOS technology has been suggested. According to the CMOS technology, power is saved at a half to a quarter of the rate of conventional power consumption. A CMOS inverter includes an NMOS transistor and a PMOS transistor. Gates of the NMOS and PMOS transistor constitute an input port of the CMOS inverter, and drains of the NMOS and PMOS transistors constitute an output port of the CMOS inverter. Conventionally, the NMOS transistor is formed within a P-well and the PMOS transistor is formed within an N-well. In general, a power supply voltage (Vdd) is applied to the N-well and a ground voltage (i.e., well bias; Vss) is applied to the P-well. The well bias applied to the P-well and N-well can play a part in enhancing a threshold voltage (Vth) and stabilizing an electric characteristic of each transistor.

A conventional NMOS transistor with a well pick area for applying a well bias is now described below with reference to FIG. 1. A PMOS transistor is similar to the NMOS transistor in construction.

Referring to FIG. 1, a P-well 4 is formed within a substrate 2. Field regions define an active region. An NMOS transistor is formed in the active region between the field regions 8. The NMOS transistor includes a gate stack and a source/drain region 22. The gate stack includes a gate insulating layer 10, a gate electrode 12, and a gate spacer 18. The source/drain region 22 is formed of a lightly doped region 14 and a heavily doped region 20. The source/drain region 22 is positioned in the P-well 4. The P-well 4 is connected to a well pickup region 24 for applying a well bias.

A drain voltage Vds is applied to a drain region of a MOS transistor. A gate voltage Vgs is applied to the gate electrode. A ground voltage Vss is applied to the source region and the well pickup region. In this figure, reference numerals 26a and 26b denote silicide layers that are formed on the gate electrode and the active region, respectively.

However, in the event that a well pickup region is formed at each MOS transistor so as to apply a well bias, a chip area increases. Accordingly, a MOS transistor has been used which has a common well pickup region, as shown in FIG. 2.

Referring to FIG. 2, three NMO transistors TR1, TR2 and TR3 have a common well pickup region 25. In FIG. 2 and FIG. 1, the same numerals denote the same components. Occupying a smaller chip area, the common well pickup region is advantageous to integration. The common well pickup region has no influence upon an NMOS transistor adjacent to the well pickup region. However, the common well pickup region causes an NMOS transistor spaced apart therefrom to be vulnerable to a latch-up phenomenon because the well resistance increases in proportion to the distance between the common well pickup region and the NMOS transistor. The latch-up phenomenon is caused by two parasitic bipolar transistors acting as one thyristor that is turned on abnormally. Due to the latch-up phenomenon, the electrical characteristic of the NMOS transistor may be varied or the MOS transistor may be damaged. In order to prevent the latch-up phenomenon, a well pickup region is advantageously formed next to each MOS transistor. Unfortunately, this increases the area of the chip.

As a result, when a well pickup region is formed in a MOS transistor, the goals of achieving excellent electrical characteristics and reducing a chip area have an inverse relationship.

Embodiments of the invention address these and other limitations in the prior art.

SUMMARY OF THE INVENTION

Embodiments of the present invention provide a semiconductor device where a chip area is reduced to achieve a high integration and a well bias is efficiently applied to a MOS transistor to enhance an electrical characteristic, and methods of fabricating the same.

BRIEF DESCRIPTION OF THE DRAWINGS

FIG. 6A through FIG. 8 are flow diagrams showing the fabrication of an SRAM cell in accordance with the invention.

DETAILED DESCRIPTION OF THE INVENTION

Figure 1:
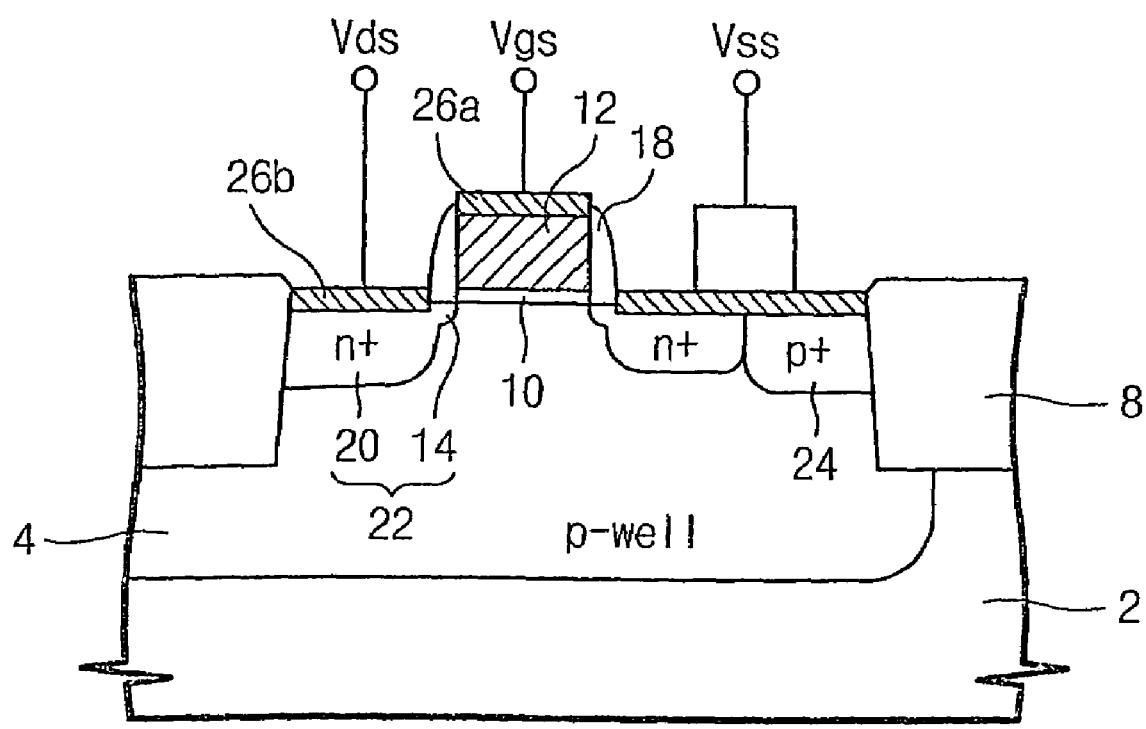
FIG. 1 is a cross-sectional diagram of a conventional MOS transistor having a well pickup region for applying a well bias.
Figure 2:
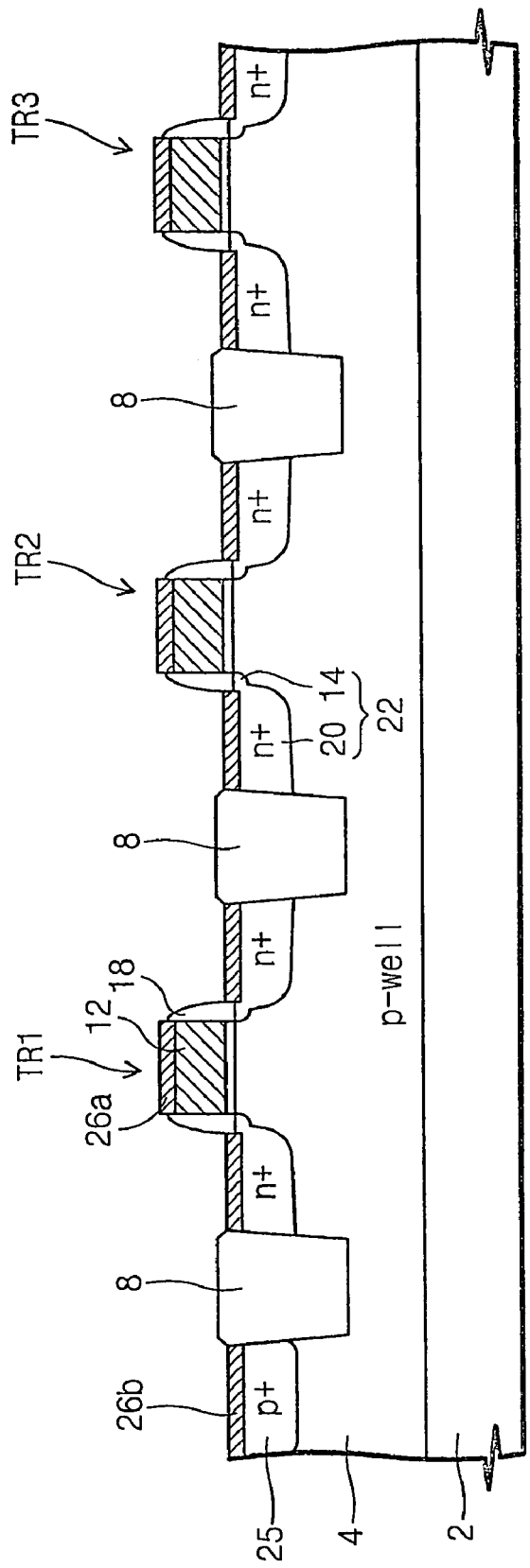
FIG. 2 is a cross-sectional diagram of a conventional MOS transistor having a common well pickup region for applying a well bias.

The invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

A semiconductor device for selectively applying a well bias in accordance with the invention is now described below beginning with reference to FIG. 3. In a region denoted as "A", a contact plug is formed in a conventional manner to be coupled to an impurity region (i.e., a source region or a drain region). In a region denoted as "B", a contact plug is formed in accordance with embodiments of the invention to be coupled to an impurity region (i.e., a source region or a drain region) and a well region. Namely, in the "B" region, a well bias may be applied to the well region.

Figure 3:
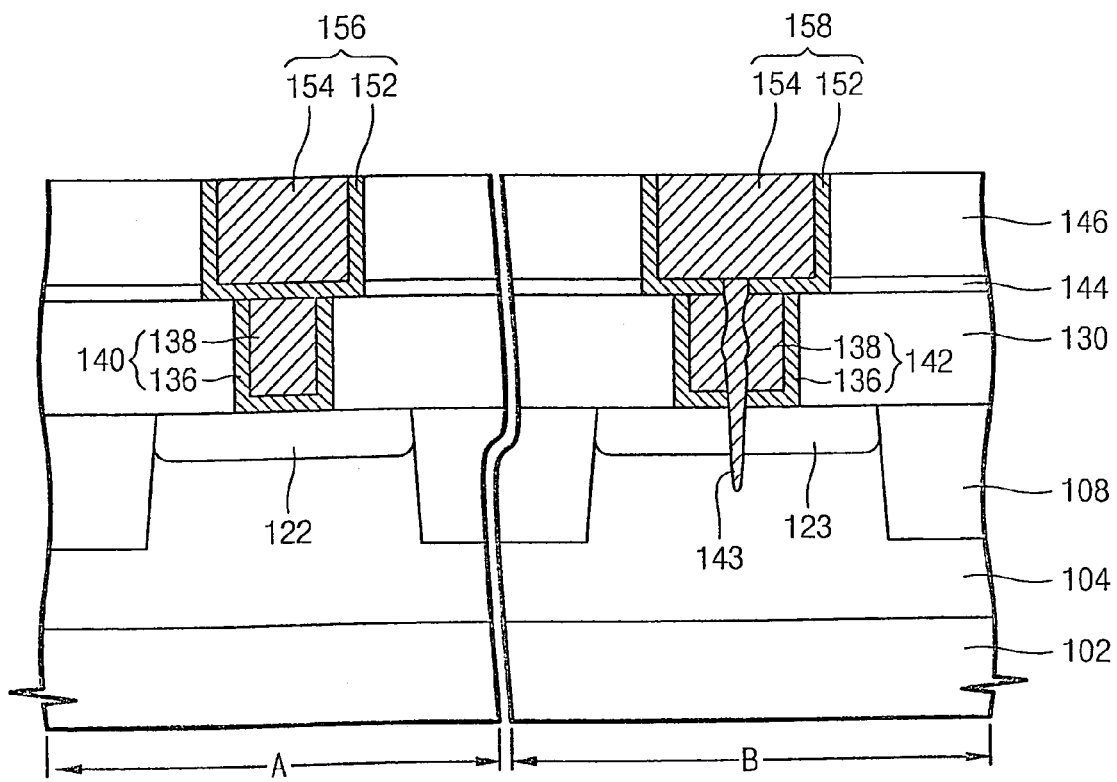
FIG. 3 is a cross-sectional diagram of a semiconductor device for selectively applying a well bias in accordance with the invention.

Referring to FIG. 3, a field region 108 is located in a substrate 102 where a well of a first conduction type 104 is formed. An active region is defined by the field region 108. A first impurity region 122 of a second conduction type is formed in an active region of the "A" region. A second impurity region 123 of the second conduction type is formed in an active region of the "B" region. A lower interlayer dielectric 130 is stacked on a substrate including the active region and the field region. In the "A" region, a first contact plug 140 is formed which is electrically connected to the first impurity region 122 through the lower interlayer dielectric 130. In the "B" region, a second contact plug 142 is formed which is electrically connected to the second impurity region 123 through the lower interlayer dielectric 130. The first and second contact plugs 140 and 142 are formed of a barrier metal layer 136 and a first conductive layer 138, respectively.

The second contact plug 142 is relatively wider than the first contact plug 140. A seam 143 coupled to the well 104 is located below the second contact plug 142. In the "B" region, a well bias may be applied without increasing a chip area due to the seam 143 extending from a lower portion of the contact plug 142 to the well 104.

An etch-stop layer 144 and an upper interlayer dielectric 146 are stacked on the lower interlayer dielectric 130 including the first and second contact plugs 140 and 142. In the "A" region, a first interconnection 156 is formed which is coupled to the first contact plug 140 through the upper interlayer dielectric 146 and the etch-stop layer 144. In the "B" region, a second interconnection 158 is formed which is coupled to the second contact plug 142 through the upper interlayer dielectric 146 and the etch-stop layer 144. The first and second interconnections 156 and 158 are formed of a barrier metal layer 152 and a second conductive layer 154, respectively.

A method of fabricating the semiconductor device for applying a well bias according to embodiments of the invention will now be described more fully below with reference to FIG. 4A through FIG. 4E.

Figure 4A:
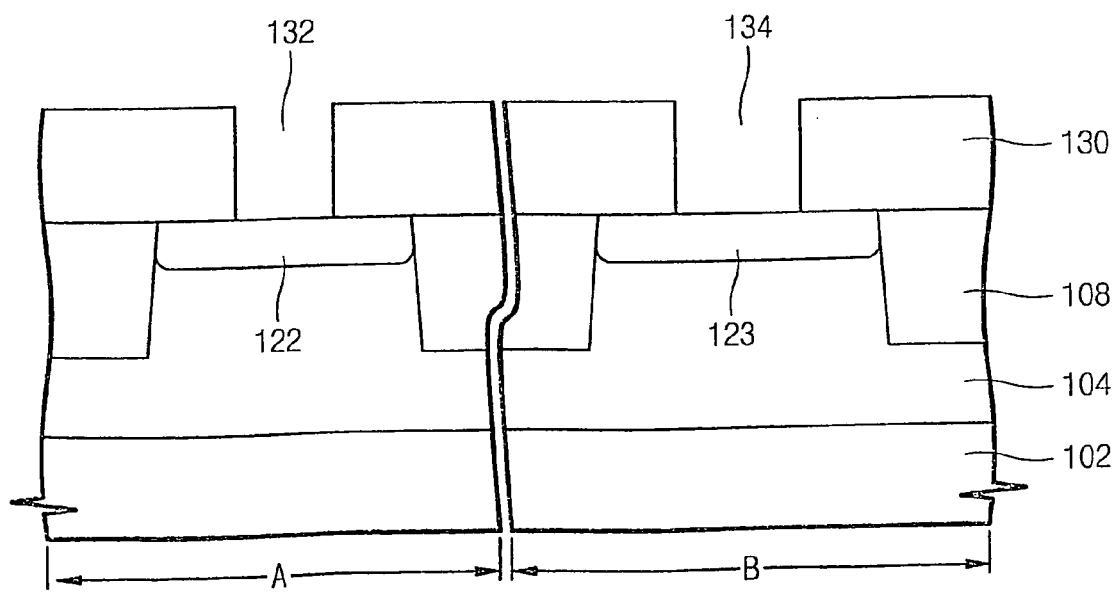
FIG. 4A through FIG. 4E are flow diagrams showing the fabrication of the semiconductor device for applying a well bias in accordance with the invention.

Referring to FIG. 4A, the well 104 of a first conduction type is formed at a substrate 102. A field region 108 is formed to define an active region. Here the field region is formed by selectively etching the substrate 102 to form a trench, burying an insulating material to fully fill the trench, and performing a chemical mechanical polishing (CMP) process, although other methods are known to those having skill in the art are also acceptable. Impurities of a second conduction type are implanted into the active region to form first and second impurity-doped regions 122 and 123. The first and second impurity-doped regions 122 and 123 correspond to a source region or a drain region of a MOS transistor. The lower interlayer dielectric 130 is formed on an entire surface of a substrate including the field region 108. By means of, for example, a conventional photolithographic process, the lower interlayer dielectric 130 is patterned to form openings 132 and 134 exposing the first and second impurity-doped regions 122 and 123. In some embodiments, the opening 134 exposing the second impurity-doped region 123 in the "B" region is larger than the opening 132 exposing the first impurity-doped region 122 in the "A" region.

Figure 4B:
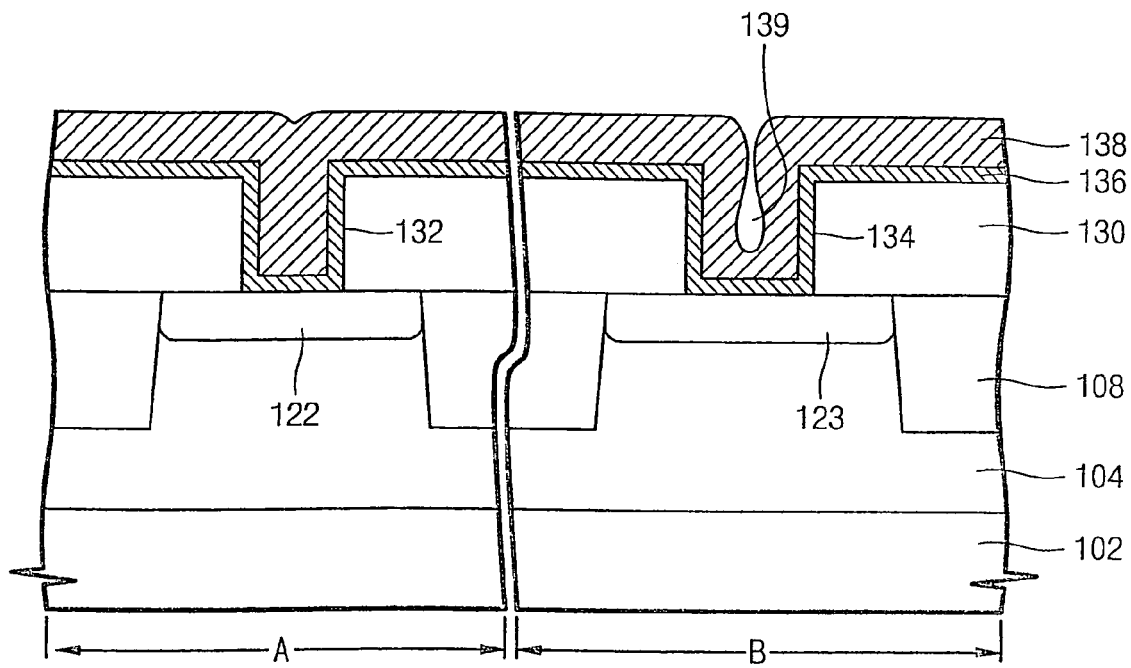

Referring to FIG. 4B, a barrier metal layer 136 is conformally formed on bottoms and sidewalls of the openings 132 and 134 and on the lower interlayer dielectric 130. A first conductive layer 138 is formed on the barrier metal layer 136. The first conductive layer 138 may be made of tungsten (W), for instance. Note that a thickness of the first conductive layer 138 is approximately half or less than a width of the opening 134 in the "B" region, to artificially form the void 139. On the other hand, the opening 132 in the "A" region is fully filled with the first conductive layer to prevent formation of the void.

Figure 4C:
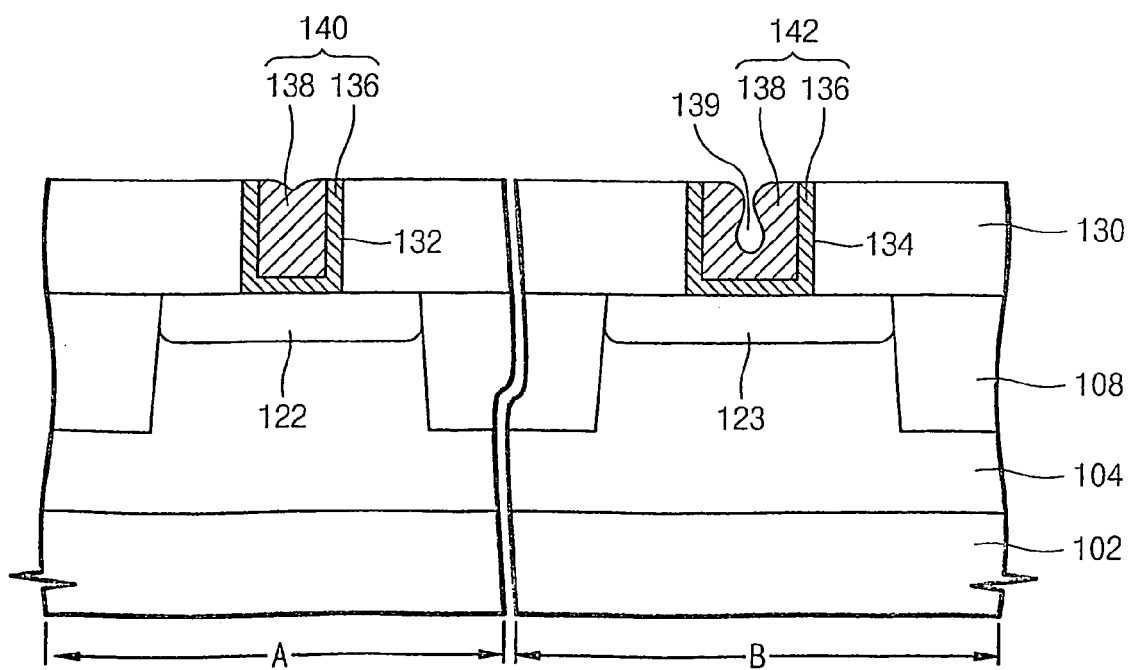

Referring to FIG. 4C, the first conductive layer 138 and the barrier metal layer 136 are planarized down to a top surface of the lower interlayer dielectric 130 by means of an etch-back technique or a CMP technique, for example. As a result, a first contact plug 140 is formed in the first opening 132 and a second contact plug 142 is formed in the second opening 134. A void 139 remains in the second contact plug 142.

Figure 4D:
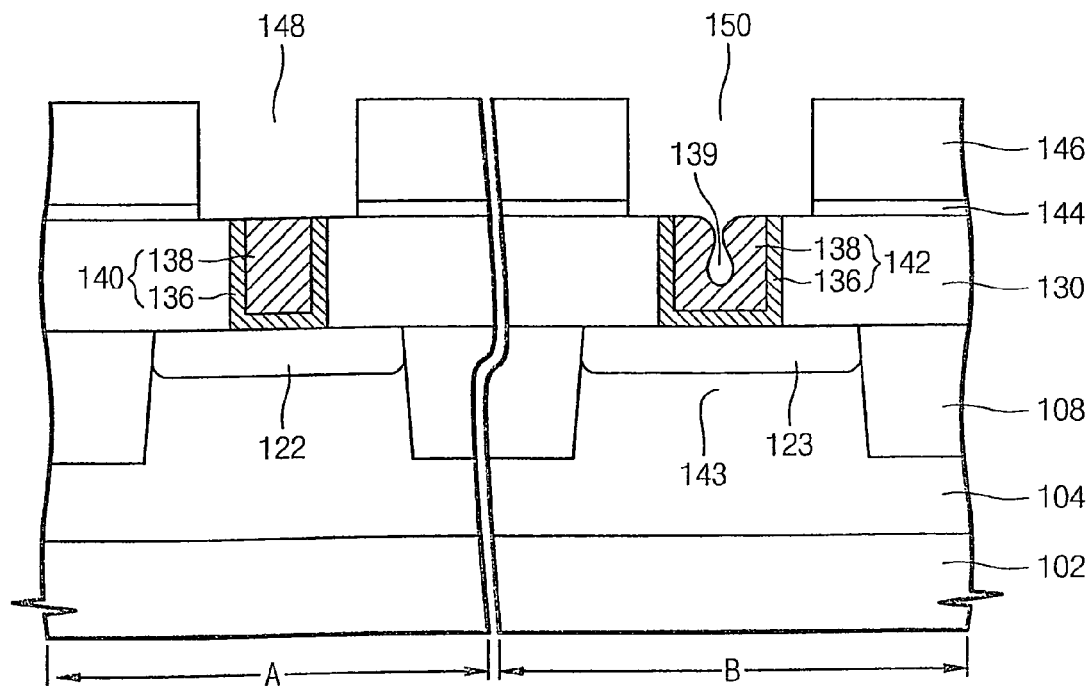

Referring to FIG. 4D, the etch-stop layer 144 and the upper interlayer dielectric 146 are sequentially stacked on a lower interlayer dielectric 130 including the first and second contact plugs 140 and 142. By means of, for instance, a conventional photolithographic process, the upper interlayer dielectric 146 and the etch-stop layer 144 are patterned to form a first interconnection groove 148 and a second interconnection groove 150. The first interconnection groove 148 exposes the first contact plug 140, and the second interconnection groove 150 exposes the second contact plug 142.

Figure 4E:
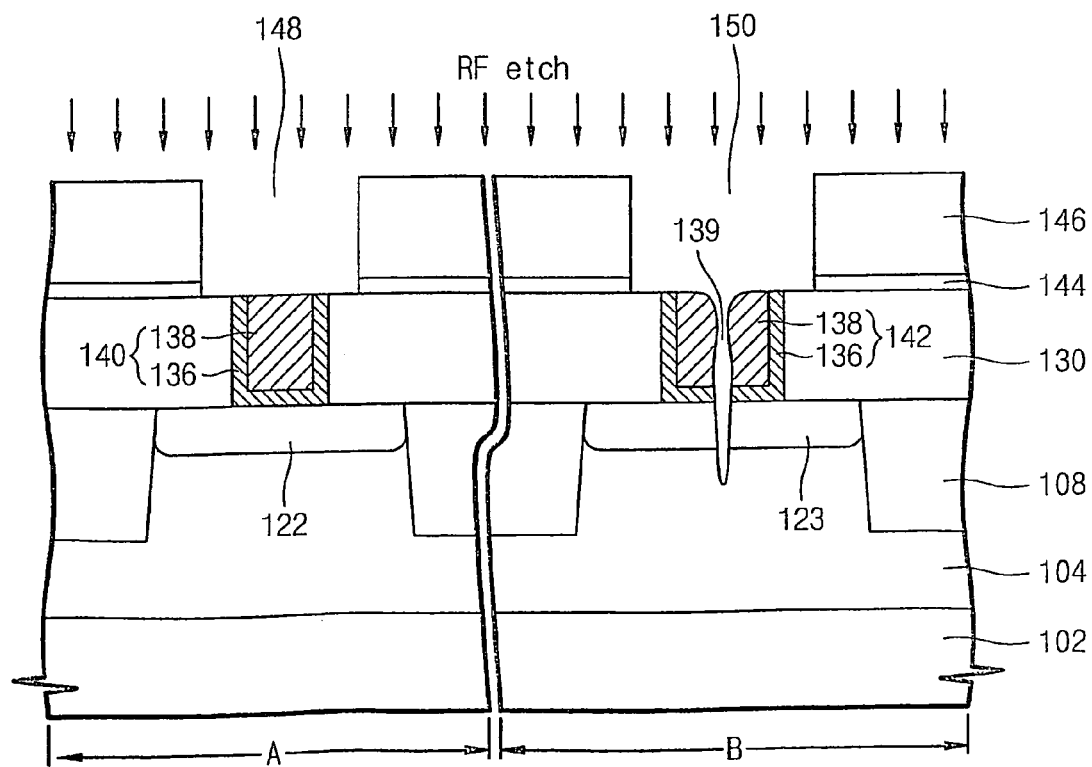

Referring to FIG. 4E, following formation of the first and second interconnection grooves 148 and 150, an RF etch is performed for the entire surface of the substrate to eliminate the impurities remaining in the first and second interconnection grooves 148 and 150. In the "B" region, the first conductive layer 138, the barrier metal 136, and a substrate underlying the void 139 are treated with the RF etch to extend the void 139 to the well 104.

Returning back to FIG. 3, a barrier metal 152 may be conformally formed in the first and second interconnection grooves 148 and 150 and over the upper interlayer dielectric 146. The second conductive layer 154 is formed on the barrier metal 152 to fully fill the first and second interconnection grooves 148 and 150. The second conductive layer 154 may be made of tungsten (W), for instance. During formation of the barrier metal 152 and the second conductive layer 154 or during a subsequent process, the void extended to the well 104 is filled with the first conductive layer 138 or the second conductive layer 154 to form the seam 143. The seam 143 connects the well 104 to the second contact plug 142. That is, a well bias can selectively be applied without forming a special well pickup region, which is advantageous in integration. The second conductive layer 154 and the barrier metal 152 are planarized down to a top surface of the upper interlayer dielectric 146 by means of an etch-back or CMP technique to form a first interconnection 156 and a second interconnection 158.

The following discussion describes a static random access memory (SRAM) that can be formed using embodiments of the invention described above. It will be apparent to a person skilled in the art that embodiments of the invention are applicable not only to a SRAM but also to other various devices, of course.

Figure 5:
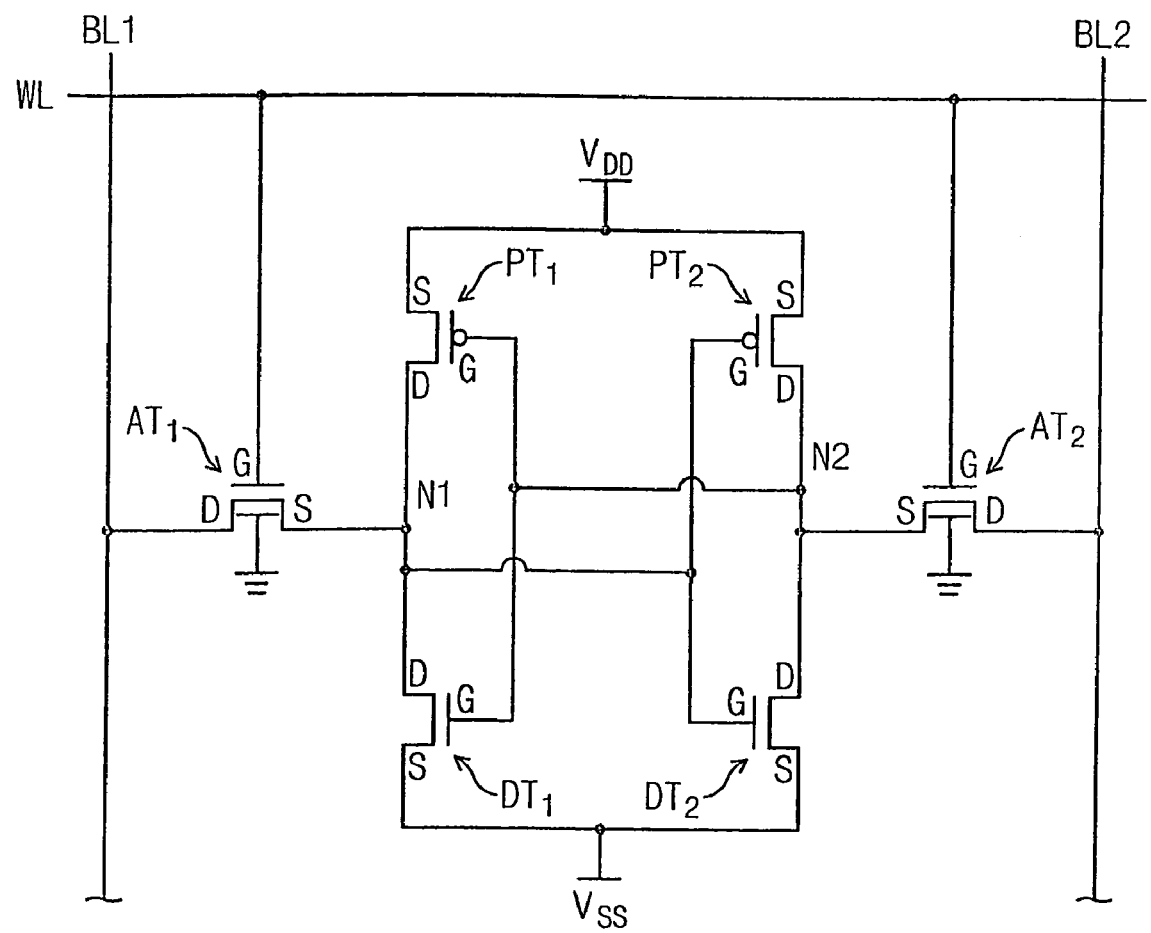
FIG. 5 is a circuit diagram of an SRAM cell.

Referring to FIG. 5, an SRAM cell has two access transistors AT1 and AT2, two pull-up transistors PT1 and PT2, and two driver transistors DT1 and DT2. The transistors PT1 and DT1 constitute a first inverter, and the transistors PT2 and DT2 constitute a second inverter. The first and second inverters are cross-coupled on two nodes N1 and N2. Source regions of the transistors DT1 and DT2 are in contact with a ground line VSS. Source regions of the transistors PT1 and PT2 are in contact with a power supply line VDD. A drain region of the transistor AT1 is in contact with a bitline BL1, and a drain region of the transistor AT2 is in contact with a bitline BL2. Source regions of the transistors AT1 and AT2 are in contact with the nodes N1 and N2, respectively. Gate electrodes of the transistors AT1 and AT2 are in contact with a common wordline WL.

Figure 6A:
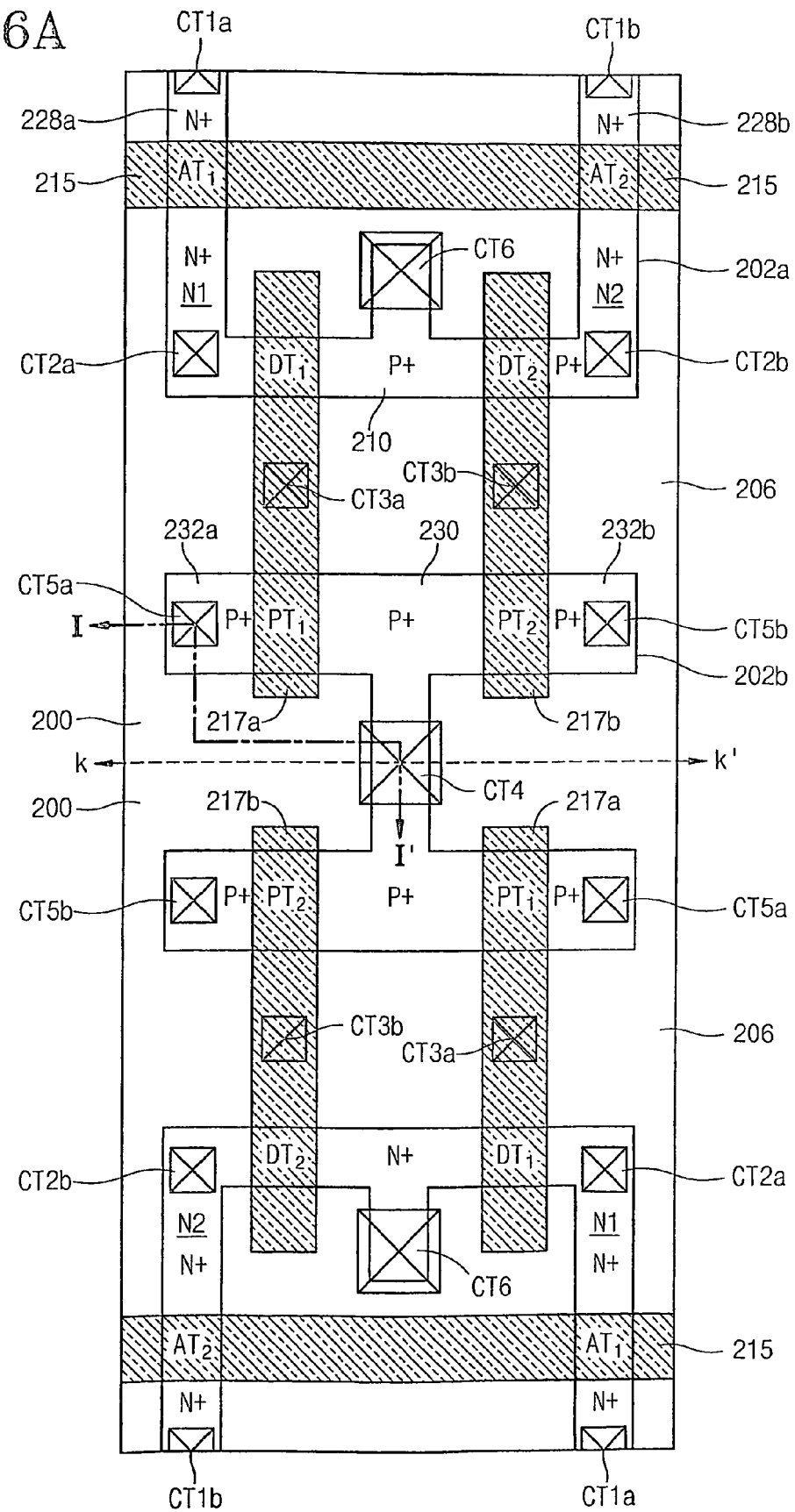
Figure 7A:
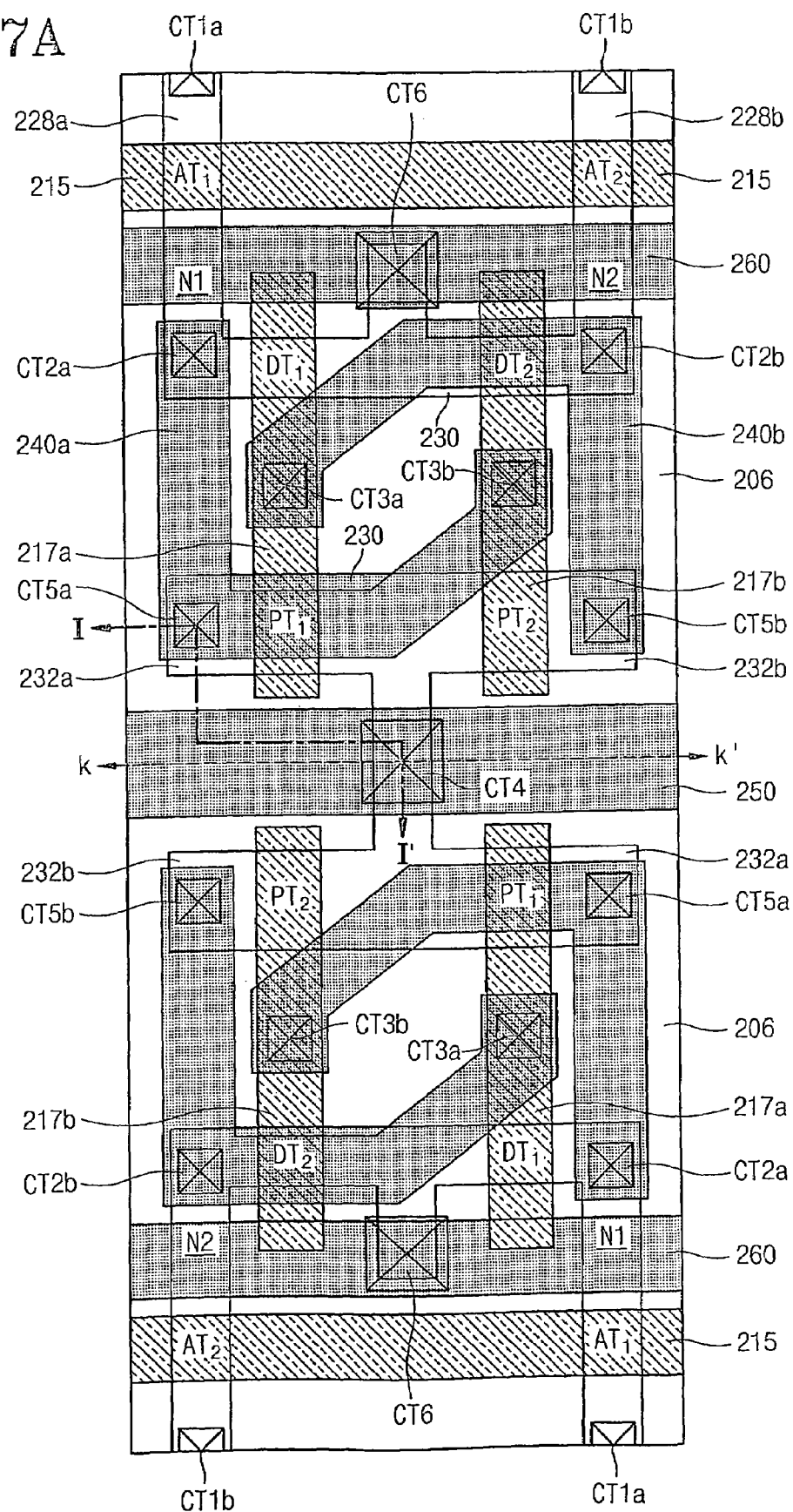
Figure 7B:
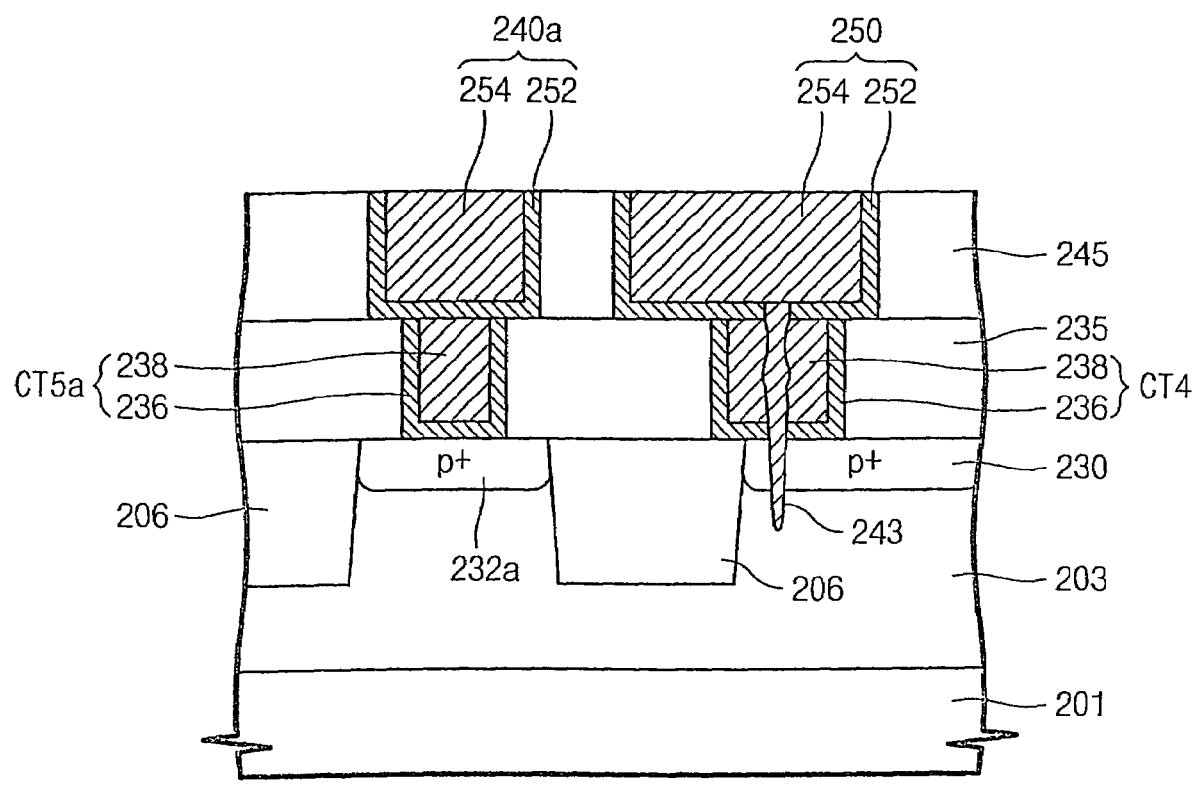
Figure 8:
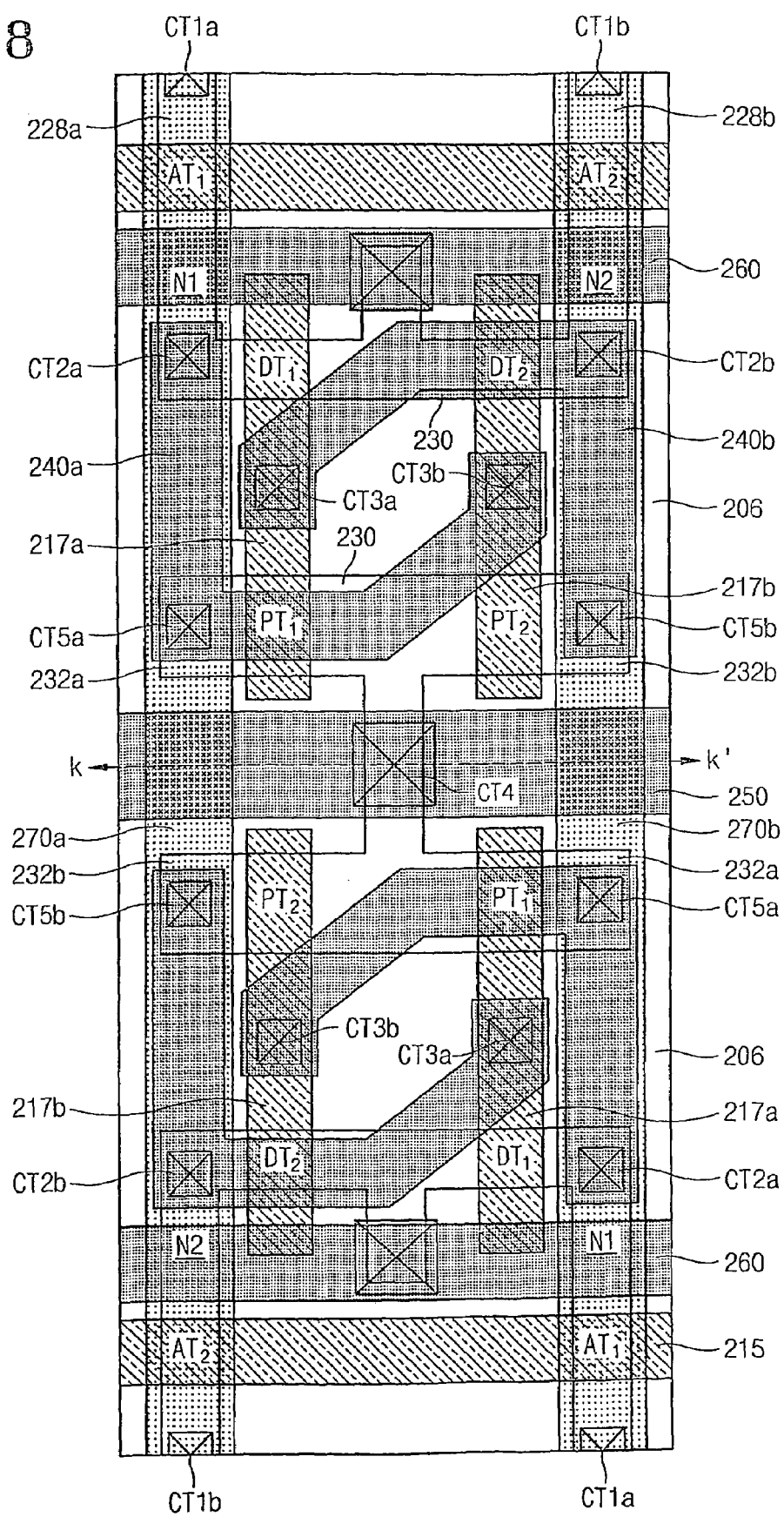

A method of fabricating an SRAM cell in accordance with embodiments of the invention is now described below with reference to FIG. 6A through FIG. 8. FIG. 6A, FIG. 7A, and FIG. 8 are top plan diagrams of an SRAM cell in which two cells are symmetrical to a line k–k'. FIG. 6B and FIG. 7B are cross-sectional diagrams taken along a line I–I' of FIG. 6A and FIG. 7A, respectively.

Referring to FIG. 6A and FIG. 6B, field regions 206 are formed in a substrate 201 including a well 203 to define active regions 202a and 202b.

Gate layers 215, 217a, and 217b cross the field region 206 and the active regions 202a and 202b. The gate layers 215, 217a, and 217b are formed of a wordline 215, a first gate electrode 217a, and a second gate electrode 217b, respectively. A gate insulating layer is interposed between the substrate and the respective gate layers.

The wordline 215 crosses over the active region 202A to form gates of the transistors AT1 and AT2.

The first gate electrode 217a is positioned to be perpendicular to the wordline 215 and crosses over the active regions 202a and 202b to form gates of the transistors DT1 and PT1. The gates of the transistors DT1 and PT1 are interconnected through the first gate electrode 217a. The second gate electrode 217B is positioned in parallel with the first gate electrode 217a to form gates of the transistors DT2 and PT2. The gates of the transistors DT2 and PT2 are interconnected through the second gate electrode 217b.

Active regions N1, N2, 228a, 228b, and 210 doped with N-type impurities (hereinbelow referred to as "N-type active regions") are formed at the active regions 202a adjacent to the wordline 215 and the first and second gate electrodes 217a and 217b. Active regions 230, 232a, and 232b doped with P-type impurities (hereinafter referred to as "P-type active regions") are formed at the active regions 202b adjacent to the first and second gate electrodes 217a and 217b.

The N-type active regions include a first node region N1 between the wordline 215 and the first gate electrode 217a, a second node region N2 between the wordline 215 and the second gate electrode 217b, a common source region 210 of the transistors DT1 and DT2 between the first and second gate electrodes 217a and 217b, a first drain region 228a of the transistor AT1, and a second drain region 228b of the transistors AT2. The first drain region 228a of the transistor AT1 is adjacent to the wordline 215 and is positioned on a reverse side of the first node region N1. The second drain region 228b of the transistor AT2 is adjacent to the wordline 215 and is positioned on a reverse side of the second node region N2.

The P-type active regions (P+regions) include a common source region 230 of the transistors PT1 and PT2 between the first and second gate electrodes 217a and 217b, a first drain region 232a of the transistor PT1, and a second drain region 232b of the transistor PT2. The first drain region 232a of the transistor PT1 is adjacent to the first gate electrode 217a and is positioned on a reverse side of the common source region 230. The second drain region 232b of the transistor PT2 is adjacent to the second gate electrode 217b and is positioned on a reverse side of the common source region 230.

A lower interlayer dielectric 235 is formed on an entire surface of a substrate including the gate layer 215, 217a, and 217b. A conductive contact plug (hereinafter referred to as "contact") is formed through the lower interlayer dielectric 235. The conductive contact plug includes contacts CT1a, CT1b, CT2a, CT2b, CT3a, CT3b, CT4, CT5a, CT5b, and CT6. The contacts CT1a and CT1b are formed at the first drain region 228a of the transistor AT1 and at the second drain region 228b of the transistor AT2, respectively. The contacts CT2a and CT2b are formed at the first node region N1 and at the second node region N2, respectively. The contacts CT3a and CT3b are formed at the first and second gate electrodes 217a and 217b, respectively. The contact CT4 is formed at the common source region 230 of the transistors PT1 and PT2. The contacts CT5a and CT5b are formed at the first drain region 232a of the transistors PT1 and at the second drain region 232b of the transistors PT2, respectively. The contact CT6 is formed at the common source region 210 of the transistors DT1 and DT2.

Note that the contacts CT4 and CT6 are larger than the other contacts in order to form not only a seam for applying a power supply voltage VDD to the transistors PT1 and PT2 through the contact CT4 and for applying a well bias to the N-well but also a seam for applying a ground voltage VSS to the transistor DT1 and DT2 through the contact CT6 and for applying a well bias to the P-well.

Referring to FIG. 6B, the contact CT4 is larger than the contact CT5a. A void 239 is formed in the contact CT4. Each of the contacts CT5a and CT4 includes the barrier metal layer 236 and the first conductive layer 238. The reference numeral 203 denotes an N-well.

Referring to FIG. 7A and FIG. 7B, a first interconnection line 240a, a second interconnection line 240b, a power supply line (VDD) 250, and a ground line (VSS) 260 are formed to interconnect the above-described contacts.

The first interconnection line 240a is connected to the first node region N1 through the contact CT2a and is connected to the first drain region 232a of the transistor PT1 through the contact CT5a. Further, the first interconnection line 240a is connected to the gate electrode 217b of the transistor PT2 and the transistor DT2 through the contact CT3b. Similarly, the second interconnection line 240b is connected to the second node region N2 through the contact CT2b and is connected to the second drain region 232b of the transistor PT2 through the contact CT5b. Further, the second interconnection line 240b is connected to the gate electrode 217a of the transistor PT1 and the transistor DT1 through the contact CT3a.

The power supply line 250 connects the common source region 230 of the transistors PT1 and PT2 and the N-well 203 to a power supply voltage through the contact CT4.

The ground line Vss 260 connects the common source region 210 of the transistors DT1 and DT2 and a P-well to a ground voltage through the contact CT6.

As shown in FIG. 7B, an upper interlayer dielectric 245 is formed on a lower interlayer dielectric 235 including the contacts CT5a and CT4. The first interconnection line 240a and the power supply line 250 are connected to the contacts CT5a and CT4 through the upper interlayer dielectric 245, respectively. During formation of the first interconnection line 240a and the power supply line Vdd 250, a seam 243 is formed under the contact CT4 to connect the N-well 203 to the contact CT4, using the process described above. That is, a well bias may selectively be applied without forming a special well pickup region. The first interconnection line 240a and the power supply line 250 are formed of the barrier metal 252 layer and the second conductive layer 254, respectively.

Referring to FIG. 8, a first bitline 270a and a second bitline 270b are positioned on the resultant structure of FIG. 7A. The first bitline 270a connects the first drain region 228a of the transistor AT1 to a bitline power through the contact CT1a. Similarly, the second bitline 270b connects the second drain region 228b of the transistor AT2 to a bitline power through the contact CT1b.

According to one aspect of the invention, a semiconductor device includes an impurity region of a second conduction type positioned in a substrate where a well of a first conduction type is formed. A lower interlayer dielectric is stacked on a substrate where the impurity region of the second conduction type and the well of the first conduction type are formed. A contact plug is formed, which is connected to the impurity region through the lower interlayer dielectric. An upper interlayer dielectric is stacked on the lower interlayer dielectric including the contact plug. An interconnection is formed, which is connected to the contact plug through the upper interlayer dielectric. A seam is formed below the contact plug to be coupled to the well, so that a well bias can be applied to the well. The impurity region may be a source region of a pull-up transistor of an SRAM cell and the interconnection may be a power supply line. Alternatively, the impurity region may be a source region of a driver transistor of an SRAM cell and the interconnection may be a ground line.

According to another aspect of the invention, a method of fabricating a semiconductor device is provided. The method includes forming a well of a first conduction type in a substrate. An impurity region of a second conduction type is formed in the well. A lower interlayer dielectric is formed on a substrate where the well of the first conduction type and the impurity region of the second conduction type are formed. In this case, a void is formed in the contact plug. An upper interlayer dielectric is formed on the lower interlayer dielectric including the contact plug. The upper interlayer dielectric is selectively etched to form an interconnection groove exposing the contact plug. The contact plug having the exposed void and the substrate are overetched to extend the void to the well of the first conduction type. The interconnection groove is filled with a conductive layer to form an interconnection. A seam connecting the contact plug to the well is formed at the void extended to the well.

While the invention has been described in connection with description of several exemplary embodiments and drawings thereof, it is capable of various changes and modifications without departing from the spirit and scope of the invention as defined in the following claims.

What is claimed is:

1. A method for fabricating a semiconductor device, comprising:
   forming a well of a first conduction type in a substrate;
   forming an impurity region of a second conduction type in the first conduction type well;
   forming a lower interlayer dielectric on the substrate including the well and the impurity region;
   selectively etching the lower interlayer dielectric to form an opening exposing the impurity region;
   filling the opening with a first conductive layer to form a contact plug, wherein a void is formed in the contact plug;
   forming an upper interlayer dielectric on the lower interlayer dielectric including the contact plug;
   selectively etching the upper interlayer dielectric to form an interconnection groove exposing the contact plug;
   overetching the contact plug and a substrate including the exposed void to expose the void to the well; and
   filling the interconnection groove with a second conductive layer to form an interconnection,
   wherein:
   a seam connecting the contact plug to the well is formed at the void extended to the well.

2. The method of claim 1, wherein:
   the formation of the contact plug comprises:
   forming a first conductive layer in the opening and on the lower interlayer dielectric; and
   chemically mechanically polishing the first conductive layer down to a top surface of the lower interlayer dielectric.

3. The method of claim 2, wherein:
   a thickness of the first conductive layer is at most a half width of the opening.

4. The method of claim 1, wherein:
   the formation of the interconnection comprises:
   forming a second conductive layer in the interconnection groove and on the upper interlayer dielectric; and
   chemically mechanically polishing the second conductive layer down to a top surface of the upper interlayer dielectric.

5. The method of claim 1, wherein:
   the well of the first conduction type is an N-type well.

6. The method of claim 5, wherein:
   the impurity region of the second conduction type is a source region of a driver transistor in the in an SRAM cell; and
   the interconnection is a ground line.

7. The method of claim 1, wherein:
   the first conduction type is P-type.

8. The method of claim 7, wherein:
   the impurity region of the second conduction type is a source region of a pull-up transistor in an SRAM cell; and
   the interconnection is a power supply line.

9. The method of claim 1, wherein:
   the contact plug and the interconnection are made of tungsten (W).

10. The method of claim 1, wherein:
    the overetch performed for extending the void to the well of the first conduction type is an RF etch.

11. A method for fabricating a semiconductor device, comprising:
    forming a well of a first conduction type in a substrate;
    forming a first impurity region and a second impurity region of a second conduction type in the first conduction type well, the first and second impurity regions being spaced apart from each other;
    forming a lower interlayer dielectric on the substrate having the first conduction type well and the impurity region of the second conduction type;
    selectively etching the lower interlayer dielectric to form a first opening exposing the first impurity region and a second opening exposing the second impurity region, the second opening being wider than the first opening;

filling the first and second openings with a first conductive layer to form a first contact plug and a second contact plug, wherein a void is formed in the second contact plug;

forming an upper interlayer dielectric on a lower interlayer dielectric including the first and second contact plugs;

selectively etching the upper interlayer dielectric to form a first interconnection groove and a second interconnection groove;

overetching the second contact plug exposed below the second interconnection groove to extend the void to the first conduction type well; and filling the first interconnection groove with a second conductive layer to form a first interconnection; and filling the second interconnection groove and filling the void by forming a seam connecting the contact plug to the well.

12. The method of claim 11, wherein:

the formation of the first and second contact plugs comprises:

forming a first conductive layer in the first and second openings and on the lower interlayer dielectric; and chemically mechanically polishing the first conductive layer down to a top surface of the lower interlayer dielectric, wherein a thickness of the first conductive layer is at most a half width of the second opening.

13. The method of claim 11, wherein:

the formation of the first and second interconnections comprises:

forming a second conductive layer in the first and second trenches and on the upper interlayer dielectric; and chemically mechanically polishing the second conductive layer down to a top surface of the upper interlayer dielectric.

14. The method of claim 11, wherein:

the first and second conductive layers are made of tungsten (W).

15. The method of claim 11, wherein:

the well of the first conduction type is an N-type well.

16. The method of claim 15, wherein:

the second impurity region of the second conduction type is a source region of a driver transistor in an SRAM cell; and the second interconnection is a ground line.

17. The method of claim 11, wherein:

the first conduction type is P-type.

18. The method of claim 17, wherein:

the second impurity region of the second conduction type is a source region of a pull-up transistor in an SRAM cell; and the second interconnection is a power supply line.

19. The method of claim 11, wherein:

the contact plug and the interconnection are made of tungsten (W).

20. The method of claim 11, wherein:

the overetch performed for extending the void to the well of the first conduction type is an RF etch.

* * * * *